United States Patent [19]
Winton et al.

[11] Patent Number: 6,017,811
[45] Date of Patent: *Jan. 25, 2000

[54] METHOD OF MAKING IMPROVED ELECTRICAL CONTACT TO POROUS SILICON

[75] Inventors: Michael J. Winton, Oakland; Stephen D. Russell, San Diego, both of Calif.

[73] Assignee: The United States of America as represented by the Secretary of the Navy, Washington, D.C.

[ * ] Notice: This patent is subject to a terminal disclaimer.

[21] Appl. No.: 08/944,746

[22] Filed: Oct. 6, 1997

Related U.S. Application Data

[63] Continuation-in-part of application No. 08/118,900, Sep. 9, 1993, abandoned.

[51] Int. Cl.$^7$ .......................... H01L 21/00; H01L 21/465
[52] U.S. Cl. .......................... 438/597; 438/694; 438/22; 438/23; 438/960; 438/34; 438/409
[58] Field of Search .................................... 438/694, 597, 438/21–23, 34, 960, 409

[56] References Cited

U.S. PATENT DOCUMENTS

| | | | |
|---|---|---|---|
| 4,128,680 | 12/1978 | Heaps et al. | 428/137 |
| 4,243,473 | 1/1981 | Yamaguchi et al. | 438/16 |
| 4,510,034 | 4/1985 | Ohshima et al. | 204/290 |
| 4,567,431 | 1/1986 | Goodman | 324/752 |
| 5,139,624 | 8/1992 | Searson et al. | . |
| 5,164,558 | 11/1992 | Huff et al. | 29/622 |
| 5,227,313 | 7/1993 | Gluck et al. | 438/66 |
| 5,266,126 | 11/1993 | Deguchi | 136/256 |
| 5,372,962 | 12/1994 | Hirota et al. | . |
| 5,420,049 | 5/1995 | Russell et al. | 438/22 |
| 5,421,958 | 6/1995 | Fathauer et al. | 216/48 |
| 5,427,977 | 6/1995 | Yamada et al. | . |
| 5,430,300 | 7/1995 | Yue et al. | . |
| 5,454,915 | 10/1995 | Shor et al. | . |
| 5,484,748 | 1/1996 | Suzuki et al. | 438/753 |
| 5,542,558 | 8/1996 | Benz et al. | . |
| 5,569,932 | 10/1996 | Shor et al. | . |
| 5,757,024 | 5/1998 | Fathauer et al. | 257/19 |
| 5,840,616 | 5/1992 | Sakaguchi et al. | 438/459 |

*Primary Examiner*—Charles Bowers
*Assistant Examiner*—Thanh Nguyen
*Attorney, Agent, or Firm*—Harvey Fendelman; Peter A. Lipovsky; Michael A. Kagan

[57] ABSTRACT

A method for manufacturing a semiconductor structure having improved light emitting characteristics includes the step of exposing a semiconductor substrate, such as a silicon wafer, to an unbiased etching solution comprised of an acid, water, and an oxidizing agent to form a porous region having interstitial spaces in the semiconductor structure. Next, an electrically conductive contact structure is formed in the interstitial spaces and on the semiconductor structure. The large surface area at the interface junction between the electrical contact layer and the porous region is believed to enhance the intensity of light emitted by the porous region by allowing increased electrical current flow across the interface junction.

24 Claims, 3 Drawing Sheets

METHOD OF MAKING IMPROVED ELECTRICAL CONTACT TO POROUS SILICON

This application is a continuation-in-part of application Ser. No. 08/118,900, filed Sep. 9, 1993 now abandoned.

BACKGROUND OF THE INVENTION

The present invention relates to the field of semiconductor devices, and more particularly to a method for forming an electrical contact to a porous silicon structure.

The band structure for single crystal silicon exhibits a conduction band minimum which does not have the same crystal momentum as the valence band maximum, yielding an indirect gap. Therefore, in silicon, radiative recombination can only take place with the assistance of a photon, making such transitions inefficient. This characteristic has prevented silicon from being used as a solid state source of light, unlike group III–V semiconductors which have a direct gap at the center of the Brillouin zone. However, the discovery of photoluminescence in porous silicon has therefore generated a new optoelectronic material for study.

Porous silicon is conventionally formed using electrochemical etching of silicon substrates. In addition to silicon layers, other materials such as germanium, silicon-germanium alloys and the like may also be etched into the porous form. The substrate may be suitably patterned lithographically prior to the etch to define device structures or confine the region exposed to the etch solution. The typical emission spectrum of porous silicon is in the red, orange and yellow region (nominally 500 to 750 nm) although green and blue emissions have also been demonstrated. Blue shift of the peak emission wavelength has been shown by increased oxidation and etching of the porous silicon. However, the efficiency of porous silicon light-emitting diodes remains low due to the difficulty in making solid state contacts to a highly porous structure.

Reversible quenching of photoluminescence may be obtained from porous silicon layers fabricated in bulk silicon due to surface adsorbates. Reversible quenching refers to a decrease in the light emission from the porous silicon that returns to its previous state of emission in the absence of the surface adsorbate. The degree of quenching nominally scales with the solvent dipole moment. Reversible quenching of porous silicon structures demonstrates that light emitting porous silicon structures are chemically fragile, i.e. their light emitting properties may be changed when they are placed in contact with a chemical element or compound. Furthermore, quenching the light emitting property is not reversible when porous silicon is subjected to some solutions and chemical elements commonly used in semiconductor processing. In addition, heating porous silicon structures and/or devices to temperatures approaching 300° C., and above, permanently destroys the light emitting (photonic) properties of porous silicon.

The light emitting mechanism of porous silicon is not fully understood. The scientific controversy surrounding the physical mechanism behind the light emission has not, however, hindered the ability to fabricate porous silicon layers and useful light emitting devices. The prior art uses evaporated or sputter-deposited layers of conductive materials such as semi-transparent gold or indium tin oxide (ITO) to make electrical contact to the porous silicon layers and device structures. These techniques are line-of-sight deposition techniques that can not fill voids in the porous silicon structure due, in part, to the large particle size and the directionality of the deposited material. The opacity of the silicon substrate used by the prior art adds an additional constraint because the electrical contacts must be optically transparent to allow emission of light from the porous silicon devices.

FIG. 1 schematically shows a prior art porous silicon region 10 formed in a silicon structure 12. The silicon structure 12 is covered by an electron beam sputtered layer of a conductive metal 20 such as indium-tin-oxide (typically 95% indium oxide, 5% tin oxide). Voids 30 formed in the silicon structure 12 are not efficiently filled which prevents effective electrical contact between the conductive metal 20 and the silicon structure 12.

Therefore, a need exists for a method for forming a low electrical resistance, high surface area contact to a mechanically, chemically and thermally fragile, porous semiconducting structure in a manner that preserves the photonic properties of the semiconductor.

SUMMARY OF THE INVENTION

The present invention is directed to a method for forming an electrical contact layer on a porous semiconductor region to enhance the intensity of light emitted by the structure. The method includes the step of exposing a semiconductor substrate, such as a silicon wafer, to an unbiased etching solution comprised of an acid, water, and an oxidizing agent to form a porous region having interstitial spaces in the semiconductor substrate with increased surface contact area. Next, an electrically conductive contact structure is formed in the interstitial spaces and on the semiconductor substrate. The large surface area at the interface junction between the electrical contact layer and the porous region is believed to enhance the intensity of light emitted by the porous region by allowing increased electrical current flow across the interface junction.

An object of the present invention is to provide an improved light emitting semiconductor structure by increasing the surface contact area between an electrical contact layer and a porous semirconductor region formed in the semiconductor substrate.

Another object of the invention is to provide a method of forming electrical contact to porous silicon without the use of an electrical bias or an electrochemical cell.

These and other objects of the invention will become more readily apparent upon review of the accompanying drawings and specification, including the claims.

DESCRIPTION OF THE PREFERRED EMBODIMENT

The description of the preferred embodiment refers to an improved method of making electrical contact to porous semiconductor structures, such as silicon. The intensity of the light emitted by porous semiconductor layers and devices may be increased by the improved electrical interconnection between the mechanically, chemically and thermally fragile porous semiconductor and the device electrodes. The improved surface morphology allows metal to interpenetrate the porous regions, thereby increasing the contact area, or junction between the porous regions and the electrode. It is believed that increasing the surface area over which electrical contact is made increases the junction area which allows increased electrical current flow across the junction. The increased electrical current flow across the junction created at the interface between the porous semiconductor region and the electrode provides an increased number of electrical charge carriers undergoing radiative recombination. The lower contact resistance results in increased device efficiency since the number of emitted photons (corresponding to the optical brightness of the device) is proportional to the electrical charge carriers undergoing radiative recombination. Regardless of the actual physical mechanism, improved surface morphology enhances the ability to make electrical contact to porous semiconductor structures.

Figure 1:
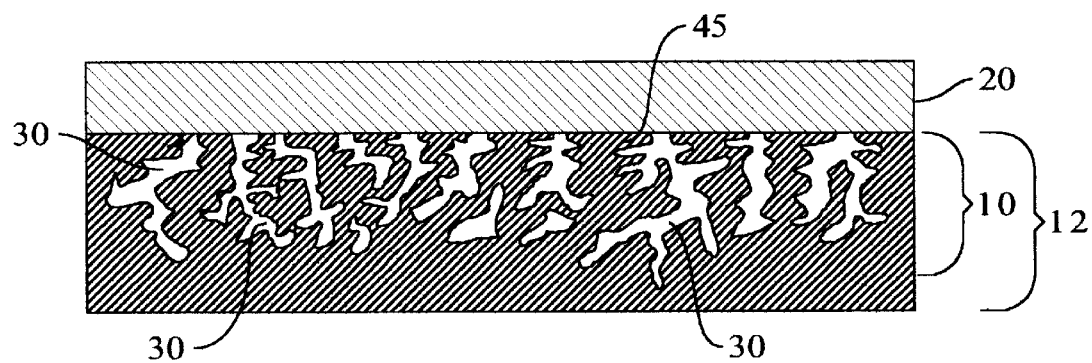
FIG. 1 is a cross-sectional view of a prior art porous silicon structure on which an electrode is formed.
Figure 2:
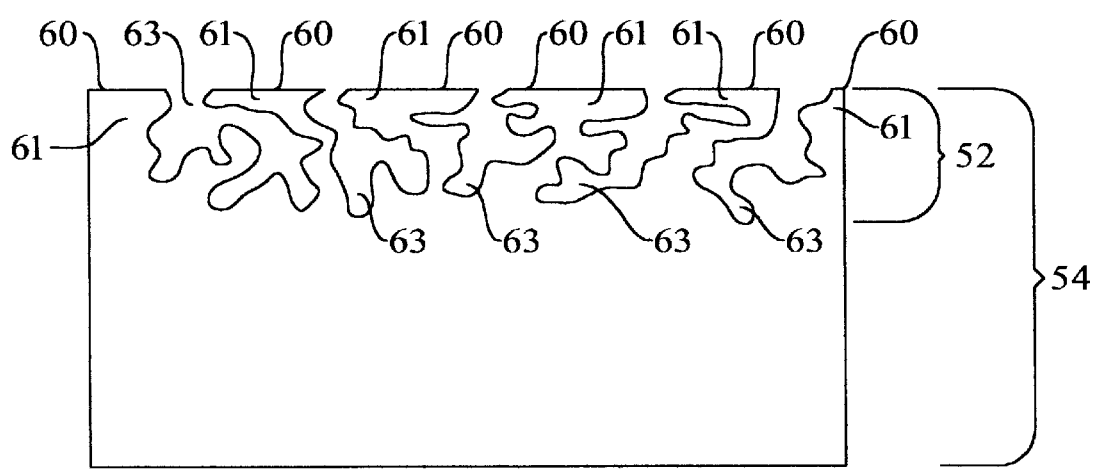
FIG. 2 is a cross-sectional view of a porous silicon structure manufactured in accordance with methods embodying various features of the present invention.
Figure 3:
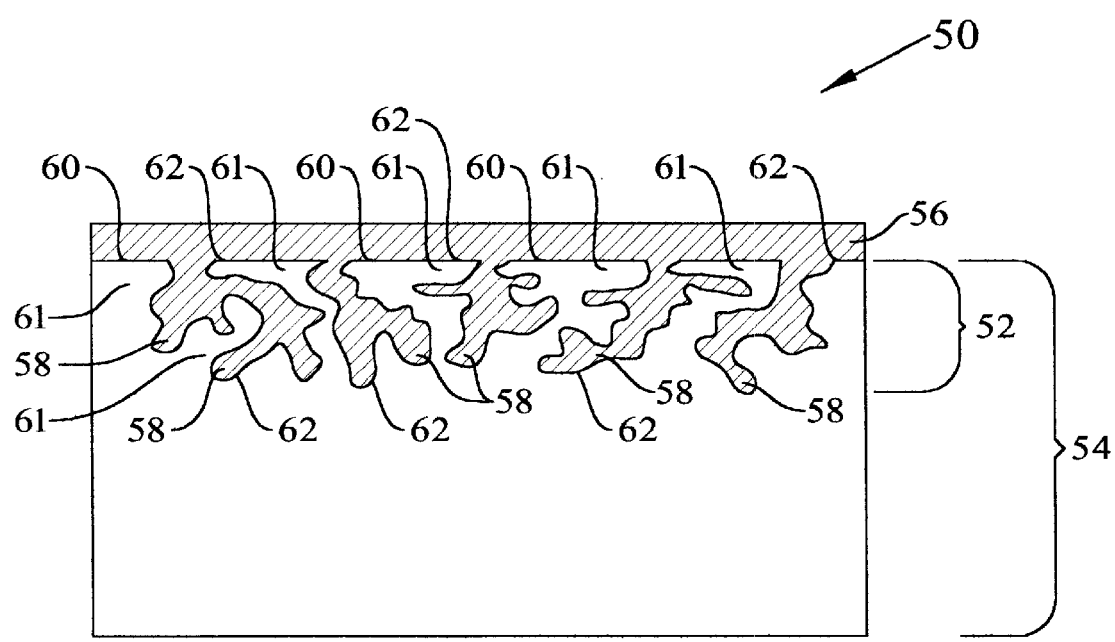
FIG. 3 is a cross-sectional view of an electrode formed over and in the porous silicon region of FIG. 2.

FIG. 2 shows a cross-section of a porous region 52 formed in semiconducting substrate 54 using methods of the present invention. Structure 50 includes a semiconductor substrate 54 in which a porous region 52 is formed by subjecting surface 60 of the substrate 54 to a stain etch, described in further detail below. The porous region 52 is comprised of islands 61 and voids 63, representing regions comprising substrate 54 where material has been etched away. Referring now to FIG. 3, an electrically conductive layer 56 formed on the surface 60 includes tendrils 58 that fill voids 63 between the islands 61 in the substrate 54 of porous region 52. The interface, or junction 62 between the semiconducting substrate 54 and the electrically conductive layer 56, including tendrils 58, provides a relatively low electrical resistance across the interface 62. In the preferred embodiment, substrate 54 is made of silicon, although other semiconducting materials such as germanium, silicon carbide, and group IV semiconductor alloys may be used. The electrically conductive layer 56 may be patterned to suit the requirements of a particular application.

By way of example, substrate 54 was prepared from commercial-grade (100)-oriented p-type and n-type silicon wafers divided into test samples. N-type silicon samples with resistivities of 0.6–0.8 Ω-cm (n+) and 3–5 Ω-cm (n–) were used, as well as p-type silicon samples with resistivities of 0.2–0.4 Ω-cm (p+) and 1.5–5 Ω-cm (p–). Two different etchants were separately used on the samples. One type of etchant consisted of $HF:HNO_3:H_2O$ in a 1:3:5 dilution; and the other etchant consisted of $HF:HNO_3:H_2O$ in a 1:5:10 dilution. Electronics grade reagents and deionized water also were used. The mixtures of acids (HF and $HNO_3$) comprising the etchants were preactivated by immersing a 0.5 $cm^2$ piece of a heavily doped p+ silicon (0.006 Ω-cm) block in the acids prior to addition of the water. It is believed that preactivation of the etchants with the p+ silicon block functions as a catalyst that provides an initial concentration of positively charged ions in the etchant that serve as oxidizing agents in the etching process. The oxidizing agents are believed to attract electrons from the silicon samples and effectively inject holes into the samples and appear to be required for the formation of the porous regions 52 in the semiconductor samples, as described in the above-cited co-pending application Ser. No. 08/118,900, incorporated herein by reference. A sufficiently large volume of etchant was used to prevent depletion of any species in the solution. Samples of each combination of silicon wafer type and etchant described above were etched for 15, 30, 45, and 60 minutes. After etching, samples were immediately immersed in deionized water and then dried with nitrogen. The hydrofluoric acid (HF) serves as an acid in the etchant solution, whereas the nitric acid ($HNO_3$) serves as an oxidizing agent. Acetic acid ($CH_3COOH$) may also be used an oxidizing agent.

Immediately after drying, samples were examined under a high-intensity ultraviolet light source (365 nm) to determine whether they exhibited photoluminescence. All combinations of wafer type, etchant chemistry, and etching time described above produced porous silicon luminescing in the red-orange region of the visible spectrum.

To demonstrate the control of the surface morphology of the porous region 52 of substrate 54, the p- and n-type samples were examined using the high-resolution stage of an ISI DS130C scanning electron microscope. The size of the islands varied little among the p+ samples etched for 15, 30, and 45 minutes, but showed a slight coarsening between 45 and 60 minutes. Samples of the p– porous silicon had a surface morphology that developed almost identically to that of the p+ silicon samples.

The most dramatic effect of prolonged reaction in the same etchant (1:5:10) on the morphology of n+ silicon as a function of time was the marked coarsening of the surface structure with time. The morphological development of porous regions 52 of n– silicon samples etched in the 1:5:10 etchant solution was intermediate between the development of the porous regions 52 in the p-type and n+ samples. Coarsening of the porous regions 52 of the samples was observed over time. However, such coarsening did not develop as rapidly as in the n+ silicon.

A comparison of the effects of differing etchant chemistries on both p+ and n+ samples was determined. The coarsening of the porous regions 52 in the p+ sample may have been slightly accelerated in the etchants having a higher HNO3 to HF ratio. A comparison of the effect of the different etchants on the porous regions 52 of the n+ samples showed that the increased $HNO_3$ to HF ratio had a much more dramatic coarsening effect than on the porous regions 52 of the p+ samples. Similar trends were also observed in samples etched for the other etching times, as well as in the n- and p-type samples.

Transmission electron microscope observations of the porous structures 52 of the n- and p-type samples revealed the stain etch included two competing etches. The first etch formed a light-emitting, porous region that varied little with processing parameters. The second, etch was delocalized, rapidly removed material on a much larger scale than the first etch, and coarsened the surface morphology of the porous region 52 to form the islands 61. It is therefore believed that the photoluminescence properties and the surface morphologies of the etched samples may be independently controlled by varying the ratio of acid to oxidizing agent in the etchant solution.

An advantage of the chemical stain (unbiased) etch used in the present invention over an electrochemical etch is that it provides the ability to control the surface morphology of the porous silicon region 52 independently of the luminescence properties of that region by variation of the etchant solution without the need to electrically bias the substrate in an electrochemical cell. A suitable surface morphology may then be obtained by exposing the silicon samples or semiconductor substrate 54 to an etchant having an increased oxidizing agent to acid ratio in solution to obtain improved electrical contact into the porous region 52.

Referring to FIG. 3, electrically conductive layer 56 may be formed, for example, by deposition of aluminum, gold, nickel, indium-tin-oxide, tin oxide, or any other electrical conductive material or material system using techniques well established in the art of semiconductor processing. The electrically conductive layer 56 also may be formed from intercalated metals of the type described in co-pending commonly assigned Application Serial No. entitled METHOD OF MAKING IMPROVED ELECTRICAL CONTACT TO POROUS SILICON USING INTERCALATED CONDUCTIVE MATERIALS, by Michael J. Winton and Stephen D. Russell, Navy Case No. 77733, filed Oct. 6, 1997, and incorporated herein by reference.

While the semiconductor structure has been described above as consisting essentially of doped p- or n-type silicon, it is to be understood that the semiconductor structure may be implemented using other types of materials or material systems such as silicon-on-sapphire (SOS), Bonded-and etched silicon-on-insulator (BESOI), and separation by ion implantation of oxygen (SIMOX).

Obviously, numerous modifications and variations of the present invention are possible in light of the above teachings. It is therefore to be understood that within the scope of the appended claims the invention may be practiced otherwise than as specifically described herein.

We claim:

1. A method of forming an electrical contact to a porous structure comprising the steps of:

stain etching a crystalline semiconductor substrate with an etching solution comprised of an acid, water, and an oxidizing agent to form a porous region having interstitial spaces in said crystalline semiconductor substrate; and forming an electrically conductive contact structure in said interstitial spaces and on said crystalline semiconductor substrate to create a semiconductor structure.

2. The method of claim 1 wherein the ratio of said oxidizing agent and said acid in said etching solution is at least in the range of about 3:1.

3. The method of claim 1 wherein said acid is hydrofluoric acid.

4. The method of claim 1 wherein said oxidizing agent is selected from the group consisting of nitric acid and acetic acid.

5. The method of claim 1 wherein said crystalline semiconductor substrate consists essentially of semiconducting material selected from the group consisting of silicon, germanium, silicon carbide, and group IV semiconductor alloys.

6. The method of claim 1 said semiconducting material is doped with a dopant having a concentration in the range of $1 \times 10^{14}$ cm$^{-3}$ to $1 \times 10^{21}$ cm$^{-3}$.

7. The method of claim 6 wherein said crystalline semiconductor substrate is doped with p-type material.

8. The method of claim 7 wherein said p-type material is boron.

9. The method of claim 6 wherein said dopant is n-type material.

10. The method of claim 9 wherein said n-type material is selected from the group of phosphorous and arsenic.

11. The method of claim 1 wherein said electrically conductive contact structure layer is formed by deposition of an electrically conductive material selected from the group that includes aluminum, gold, nickel, indium-tin-oxide, tin oxide, and intercalated metals.

12. The method of claim 1 further including the step of rinsing said etching solution from said crystalline semiconductor substrate.

13. The method of claim 1 further including the step of drying said crystalline semiconductor substrate with dry nitrogen.

14. The method of claim 1 further including the step of immersing p+ doped material into said etching solution prior to stain etching said crystalline semiconductor substrate.

15. The method of claim 14 wherein said p+ doped material includes silicon.

16. A method of forming an electrical contact to a porous structure comprising the steps of:

exposing a semiconductor substrate to an unbiased etching solution comprised of an acid, water, and an oxidizing agent to form a porous region having interstitial spaces in said crystalline semiconductor substrate; and forming an electrically conductive contact structure in said interstitial spaces and on said crystalline semiconductor substrate to create a semiconductor structure.

17. The method of claim 16 wherein the ratio of said oxidizing agent and said acid in said etching solution is at least in the range of about 3:1.

18. The method of claim 16 wherein said acid is hydrofluoric acid.

19. The method of claim 16 wherein said oxidizing agent is selected from the group consisting of nitric acid and acetic acid.

20. The method of claim 16 wherein said crystalline semiconductor substrate consists essentially of semiconducting material selected from the group consisting of silicon, germanium, silicon carbide, and group IV semiconductor alloys.

21. The method of claim 16 wherein said electrically conductive contact structure layer is formed by deposition of an electrically conductive material selected from the group that includes aluminum, gold, nickel, indium-tin-oxide, tin oxide, and intercalated metals.

22. The method of claim 16 further including the step of immersing p+ doped material into said etching solution.

23. The method of claim 22 wherein said p+ doped material includes silicon.

24. The method of claim 23 further including the step of immersing p+ doped material into said etching solution prior to exposing said crystalline semiconductor substrate to said unbiased etching solution.

* * * * *